US007205230B2

(12) United States Patent
Mashino (10) Patent No.: US 7,205,230 B2
(45) Date of Patent: Apr. 17, 2007

(54) PROCESS FOR MANUFACTURING A WIRING BOARD HAVING A VIA

(75) Inventor: Naohiro Mashino, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 89 days.

(21) Appl. No.: 10/914,227

(22) Filed: Aug. 10, 2004

(65) Prior Publication Data

US 2005/0048770 A1 Mar. 3, 2005

(30) Foreign Application Priority Data

Aug. 25, 2003 (JP) ............... 2003-299706

(51) Int. Cl.
*H01L 21/44* (2006.01)
(52) U.S. Cl. .............. 438/662; 438/622; 438/623; 438/624; 438/660; 438/661; 438/667; 438/672; 438/675; 438/795
(58) Field of Classification Search ........ 438/622–624, 438/660–662, 667, 672, 675, 795
See application file for complete search history.

(56) References Cited

U.S. PATENT DOCUMENTS

| | | | | |
|---|---|---|---|---|
| 4,920,070 A | * | 4/1990 | Mukai | 438/632 |
| 5,110,759 A | * | 5/1992 | Mukai | 438/636 |
| 5,340,947 A | | 8/1994 | Credle et al. | |
| 5,380,678 A | * | 1/1995 | Yu et al. | 438/627 |
| 5,454,928 A | | 10/1995 | Rogers et al. | |
| 6,676,892 B2 | * | 1/2004 | Das et al. | 419/7 |

(Continued)

FOREIGN PATENT DOCUMENTS

JP 03050888 3/1991

(Continued)

OTHER PUBLICATIONS

"Methods for Repairing Void in Buried or Passivated Circuits," IBM Technical Disclosure Bulletin, vol. 36, No. 11, Nov. 1993.

(Continued)

*Primary Examiner*—Michael Trinh
*Assistant Examiner*—Bac H. Au
(74) *Attorney, Agent, or Firm*—Staas & Halsey LLP (57) ABSTRACT

A process for manufacturing a wiring board comprising a substrate made of an insulation material and having first and second surfaces, first and second conductor patterns formed on the first and second surfaces, respectively, and a via conductor penetrating the substrate to electrically connect the first conductor pattern with the second conductor pattern; the process comprising the following steps of: forming the substrate with a through-hole penetrating thereto and defining openings at the first and second surfaces, respectively; plating the substrate with a metal so that a metal layer having a predetermined thickness is formed on the respective first and second surfaces of the substrate and the through-hole is substantially filled with the metal to be the via conductor; irradiating a laser beam, as a plurality of spots, around a metal-less portion of the plated metal, such as a dimple or seam, at positions corresponding to the openings of the through-hole, so that the a part of the plated metal melts to fill the metal-less portion with the molten metal.

8 Claims, 6 Drawing Sheets

U.S. PATENT DOCUMENTS

| | | | |
|---|---|---|---|
| 6,812,549 B2 * | 11/2004 | Umetsu et al. | 257/621 |
| 6,835,657 B2 * | 12/2004 | Ong | 438/662 |
| 2003/0035272 A1 | 2/2003 | Curcio et al. | |
| 2003/0135994 A1 | 7/2003 | Shutou et al. | |

FOREIGN PATENT DOCUMENTS

| | | |
|---|---|---|
| JP | 2002-016357 | 1/2002 |
| JP | 2002261439 | 9/2002 |

OTHER PUBLICATIONS

"Thin Film Circuit Line Repair Using a Laser," Research Disclosure, Mason Publications, Aug. 1992.

European Search Report issued Nov. 4, 2005 for European Patent Application No. 04254904.8.

* cited by examiner

PROCESS FOR MANUFACTURING A WIRING BOARD HAVING A VIA

BACKGROUND OF THE INVENTION

1. Field of the Invention

The present invention relates to a process for manufacturing a wiring board having a via and, more specifically, to a method for forming a via penetrating a substrate made of an insulation material while filling metal, by plating in a through-hole formed in the substrate, so that a plated metallic layer of a predetermined thickness is formed on the surface of the substrate.

2. Description of the Related Art

Figure 6:
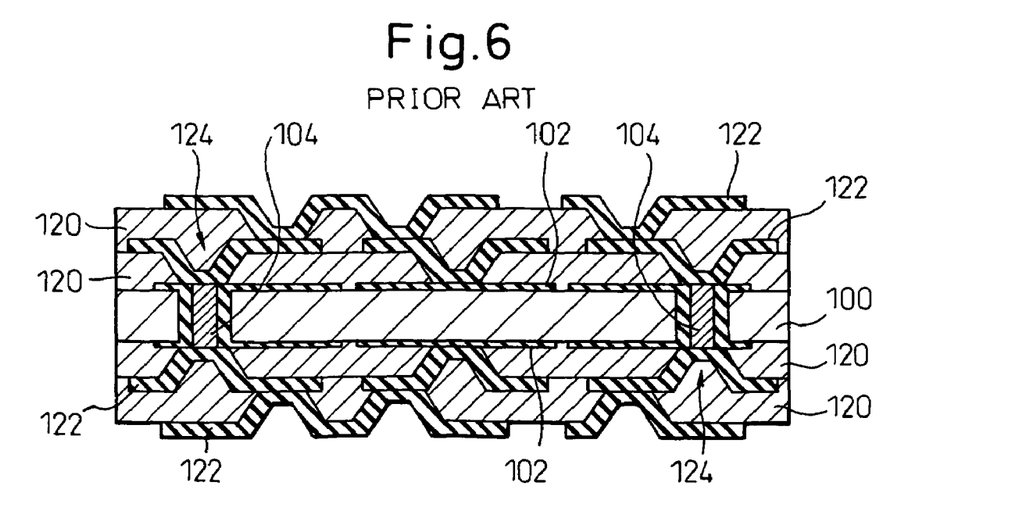
FIG. 6 is a sectional view for illustrating one example of a multi-layer wiring substrate.

A multi-layer wiring substrate shown in FIG. 6 is used in an electronic part such as a semiconductor device. In the multi-layer wiring substrate shown in FIG. 6, wiring patterns 102, 102, ... formed on opposite surfaces of a core substrate 100 of an insulation material such as a ceramic, a resin or others, are electrically connected to wiring patterns 122, 122, ... formed in insulation layers 120, 120, ... made of an insulation material such as a resin or others by vias 104, 104, ... formed to penetrate the core substrate 100 and vias 124, 124, . . . formed in the insulation layers 120, 120, . . . .

A method for manufacturing such a core substrate 100 is disclosed, for example, in Japanese Unexamined Patent Publication (Kokai) No. 2002-16357 (paragraphs [0034] to [0047], FIGS. 2 and 3).

The method for manufacturing the core substrate 100 described in the above-mentioned patent document will be explained below with reference to FIGS. 7(a) to 7(g).

Figure 7A:
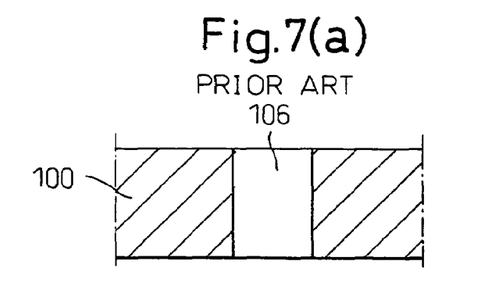
FIGS. 7(a) to 7(g) illustrate a method for manufacturing a core substrate constituting the multi-layer wiring substrate shown in FIG. 6.
Figure 7B:
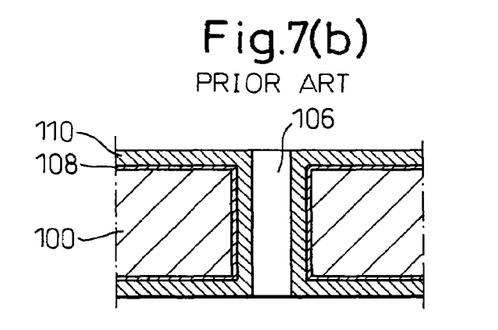

First, a thick metallic layer 110 is formed on all surfaces of the core substrate 100, including an inner wall surface of a through-hole 106 bored in the core substrate 100 by a drill or others, by electrolytic plating in which a metallic layer 108 formed by electrolytic plating is used as a power supply layer (see FIGS. 7(a) and 7(b)).

Figure 7C:
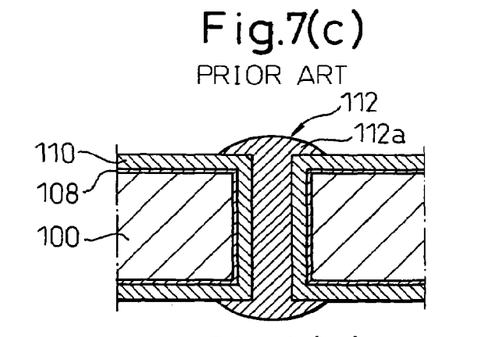
Figure 7D:
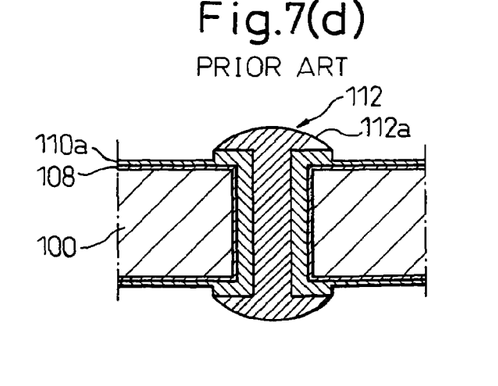

Further, the through-hole 106, in which the metallic layers 108 and 110 are formed on the inner wall surface, is filled with resin 112, so that dome-like portions 112a are formed at opposite openings of the through-hole 106 (see FIG. 7(c)). Then, the metallic layer 110 is subjected to the etching while using the dome-like portion 112a as a mask and is thinned to be a thin metallic layer 110a (see FIG. 7(d)).

Figure 7E:
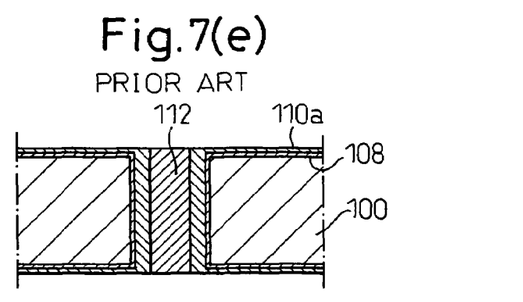
Figure 7F:
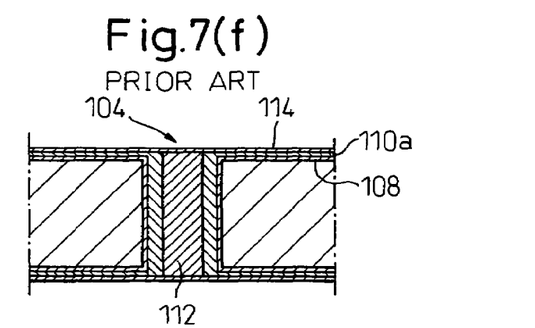

Then, the dome-like portion 112a is removed by the grinding or others so that an exposed surface of the resin 112 is flush with the surface of the thin metallic layer 110a (see FIG. 7(e)), and thereafter, a metallic layer 114 is formed on the thin metallic layer 110a and the exposed surface of the resin layer 112 by the electroless plating, whereby the via 104 penetrating the core substrate 100 is obtained (FIG. 7(f)).

Figure 7G:
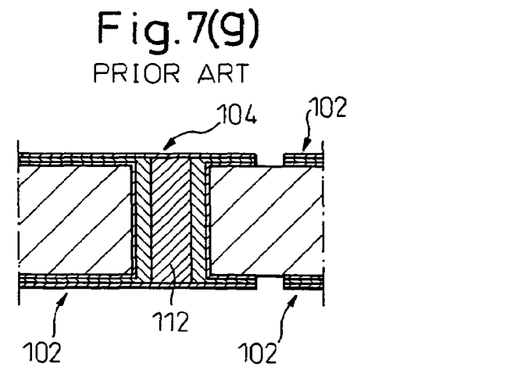

Thereafter, the wiring patterns 102, 102, ... of a desired shape are formed by patterning a multi-metallic layer consisting of the metallic layer 108, the thin metallic layer 110a and the metallic layer 114 (see FIG. 7(g)) to result in the core substrate 100 shown in FIG. 6.

According to the core substrate 100 shown in FIGS. 6 and 7(a) to 7(g), the wiring patterns 102 are formed on opposite ends of the vias 104, 104, ... to facilitate the degree of freedom in the design of the wiring pattern 102.

However, as the via 104 of the core substrate 100 is formed of metal and resin, the electric properties thereof being largely different from each other, an improvement in electrical characteristics, such as impedance, is limited.

In this regard, it has been proposed to fill metal, by plating, in a through-hole, in advance, during the formation of a substrate made of an insulation material.

Figure 8A:
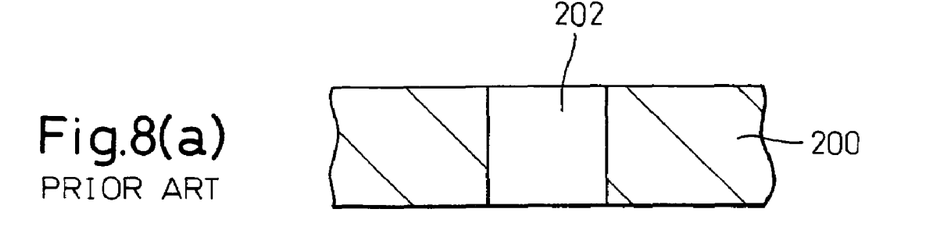
FIGS. 8(a) to 8(d) illustrate another method for manufacturing a core substrate constituting the multi-layer wiring substrate shown in FIG. 6.
Figure 8B:
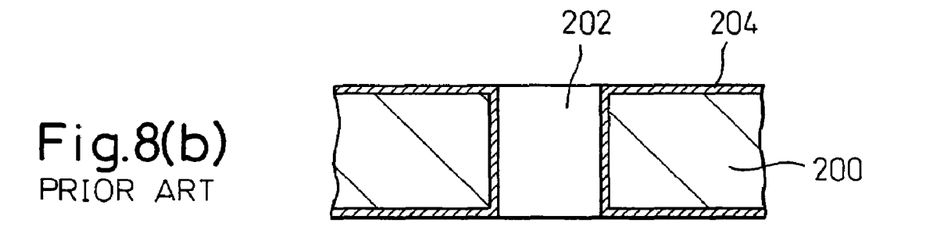

According to this method for forming the via, after forming a through-hole 202 in a substrate 200 made of an insulation material, as shown in FIG. 8(a), a seed layer 204 of metal is formed on a surface of the substrate 200 including an inner wall surface of the through-hole 202 by electroless plating as shown in FIG. 8(b).

Figure 8C:
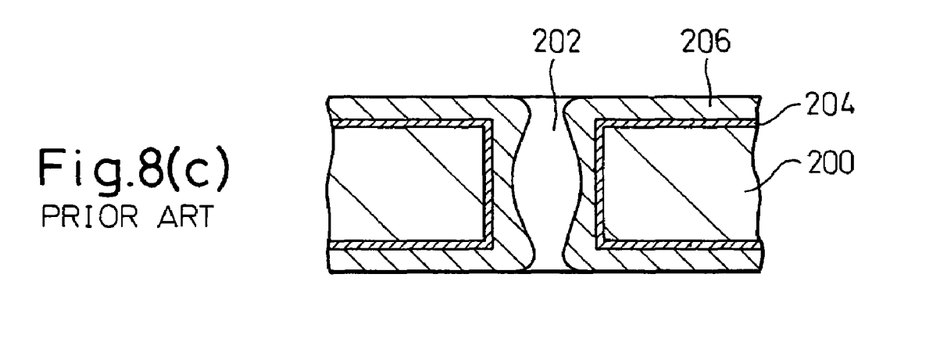

Then, electrolytic plating is carried out while using the seed layer 204 as a power supply layer, to form a plated metallic layer 206 on the seed layer 204 as shown in FIG. 8(c).

Figure 8D:
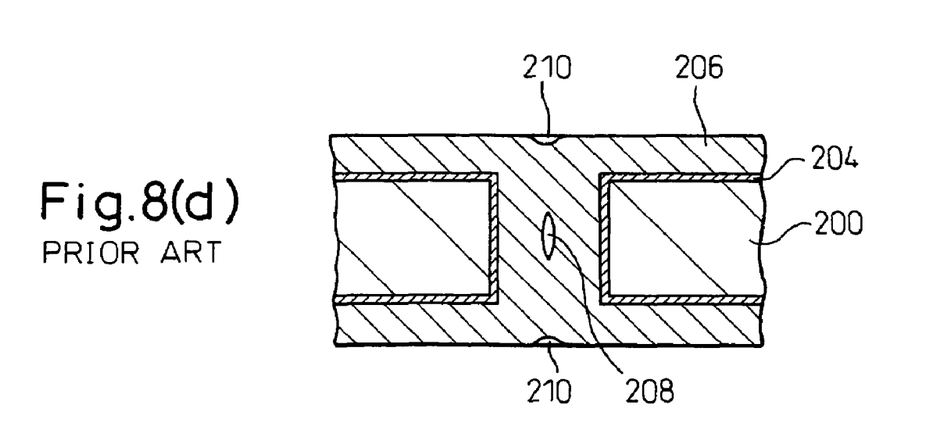

When the electrolytic plating is continued, the through-hole 202 is filled with metal to complete the via as shown in FIG. 8(d), and the plated metallic layer 206 of a predetermined thickness is formed on the surface of the substrate 200.

Thereafter, the plated metallic layer 206 is patterned to form a desired wiring pattern on each of the opposite surfaces of the substrate 200. Thus, a wiring substrate having the via, both of which ends are connected to the wiring patterns, is obtained.

However, as shown in FIG. 8(d), a void 208 may possibly be generated in the via or dimples 210 and 210 may possibly be formed in the plated metallic layer 206 at positions corresponding to the center of the openings of the through-hole 202.

If the depth of such dimples 210 and 210 is smaller than a thickness of the plated metallic layers 206 formed on the respective surfaces of the substrate 200, it is possible to remove the dimples 210 and 210 by removing the plated metallic layer 206 by etching or other methods.

Figure 9A:
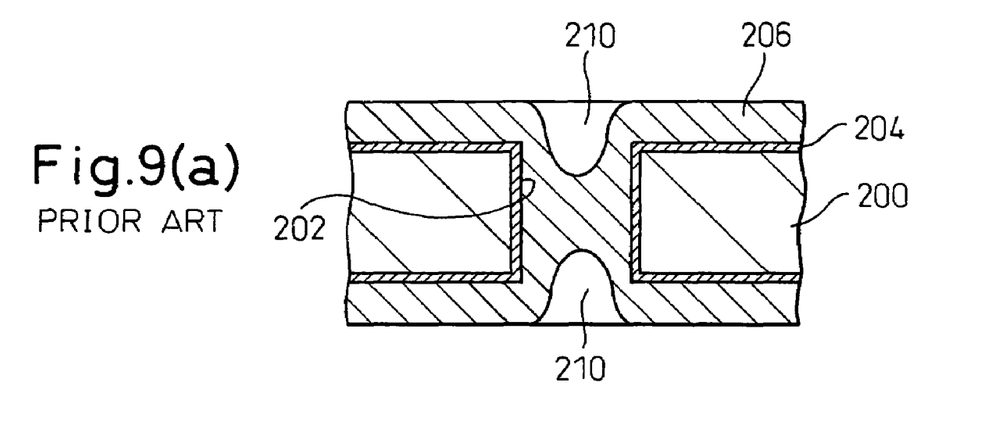
FIGS. 9(a) and 9(b) are partially sectional views for explaining the problems in the method for manufacturing the core substrate shown in FIG. 8.

However, if the depth of the dimples 210 and 210 exceeds the thickness of the plated metallic layer 206 as shown in FIG. 9(a), the dimples 210 and 210 are not completely removable even if the plated metallic layer 206 is removed by etching or other methods.

Figure 9B:
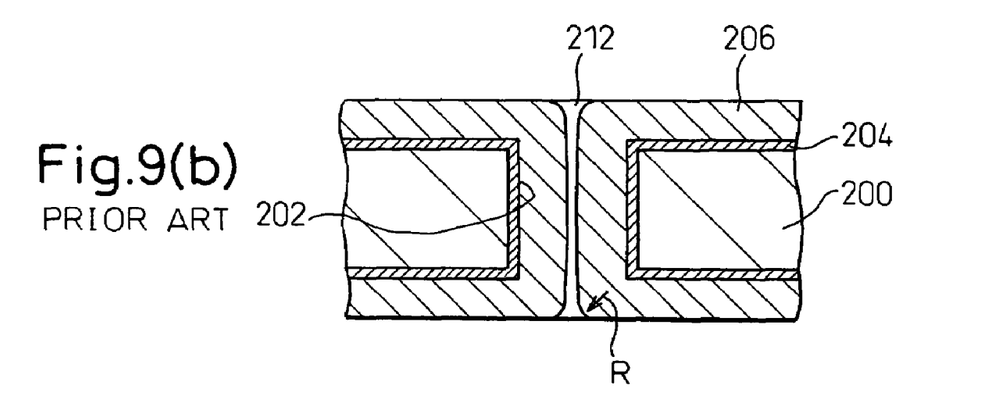

Also, if the through-hole 202 is not completely closed to leave a thin hole (seam) 212 as shown in FIG. 9(b), the seam 212 is still left as it is even if the plated metallic layer 202 is removed by the etching or others.

In addition, a number of vias must be formed, in general, in the core substrate 100, and it is extremely difficult to optimize the plating condition for all the through-holes 202 formed in the substrate 200. Accordingly, there may be some vias having the dimple 210 or the seam 212 among the plurality of vias formed in the substrate 200.

There is a risk, in the substrate having vias in which dimples 210 or seams 212 exist, that the electric connection between the via and the wiring pattern becomes worse if the wiring pattern is formed directly on each of the opposite end surfaces of the respective via. Accordingly, in general, a wiring pad having a diameter larger than that of the through-hole 202 is provided on each of the opposite end surfaces of the via to ensure the electric connection between the both.

However, the provision of the wiring pad having the larger diameter on each of the opposite end surfaces of the respective via is problematic in that the degree of freedom is reduced in the design of wiring pattern formed in the substrate, and a high-density arrangement of the wiring pattern becomes difficult.

SUMMARY OF THE INVENTION

Accordingly, an object of the present invention is to provide a process for manufacturing a wiring board, having a via, particularly obtained by filling metal by plating in a through-hole formed in a substrate of insulation material, which via is non-problematic even if a wiring pattern is formed directly on the end surface thereof.

The inventor of the present invention has attained the object on the basis of an idea that, when the via is formed by filling metal by plating in the through-hole formed in the substrate made of an insulation material, it is effective to fill metal in a metal-less portion of a plated metallic layer corresponding to the opening of the through-hole, such as a dimple or a seam, in which no metal is filled.

By this study, the inventor has become aware of that it is possible to fill the metal-less portion with molten metal obtained by emitting a YAG laser beam to a plurality of points in the plated metallic layer in the vicinity of the peripheral edge of the opening having the metal-less portion, and has reached the present invention.

According to the present invention, there is provided a process for manufacturing a wiring board comprising a substrate made of an insulation material and having first and second surfaces, first and second conductor patterns formed on the first and second surfaces, respectively, and a via conductor penetrating the substrate to electrically connect the first conductor pattern with the second conductor pattern; the process comprising the following steps of: forming the substrate with a through-hole penetrating thereto and defining openings at the first and second surfaces, respectively; plating the substrate with a metal so that a metal layer having a predetermined thickness is formed on the respective first and second surfaces of the substrate and the through-hole is substantially filled with the metal to be the via; irradiating a laser beam, as a plurality of spots, around a metal-vacant portion of the plated metal, such as a dimple or seam, at positions corresponding to the openings of the through-hole, so that a part of the plated metal melts to fill the metal-vacant portion with the molten metal.

According to another aspect of the present invention, there is provided a process for manufacturing a wiring board comprising a substrate made of an insulation material and having first and second surfaces, first and second conductor patterns formed on the first and second surfaces, respectively, and a via conductor penetrating the substrate to electrically connect the first conductor pattern with the second conductor pattern; the process comprising the following steps of: forming the substrate with a through-hole to penetrate the substrate from the first surface to the second surface; plating the substrate with a metal so that a metal layer having a predetermined thickness is formed on the respective first and second surfaces of the substrate and the through-hole is substantially filled with the metal to be the via; covering with a metal foil or metal powder a metal-less portion of the plated metal, such as a dimple or seam, at positions corresponding to the openings of the through-hole; irradiating a laser beam, as a plurality of spots, onto the metal foil or metal powder, so that at least a part of the metal foil or powder melts to fill the metal-less portion with molten metal.

According to the present invention, the laser beam is sequentially emitted along the peripheral edge of the metal-less portion to melt part of the plated metal layer in the vicinity of the peripheral edge of the metal-less portion, which molten metal is filled in the metal-less portion such as a dimple or a seam, formed in the plated metallic layer corresponding to the opening of the through-hole.

Also, by sequentially emitting the laser beam along a spiral path starting from the proximity of the peripheral edge of the opening of the through-hole and going inward of the opening, the metal-less portion once filled with the molten metal is molten again, whereby it is possible to homogenize the plated metallic layer corresponding to the opening of the through-hole.

According to the present invention, even if the metal-vacant portion, such as a dimple or a seam, is formed in the plated metallic layer at a position corresponding to the opening of the through-hole formed in the substrate of insulation material, it is possible to fill the metal-less portion with molten metal which is part of the plated metal layer in the vicinity of the peripheral edge of the metal-less portion by the spot-like emission of the laser beam onto a plurality of points thereof.

In such a manner, by filling the metal-less portion with molten metal and removing the plated metallic layer formed on the surface of the substrate, it is possible to obtain a via having a flat end surface, on which can be directly formed the wiring pattern.

As a result, it is possible to increase the degree of freedom in the design of wiring pattern formed in the substrate, and thus to facilitate the high-density arrangement of the wiring pattern.

DETAILED DESCRIPTION OF THE PREFERRED EMBODIMENTS

Figure 1:
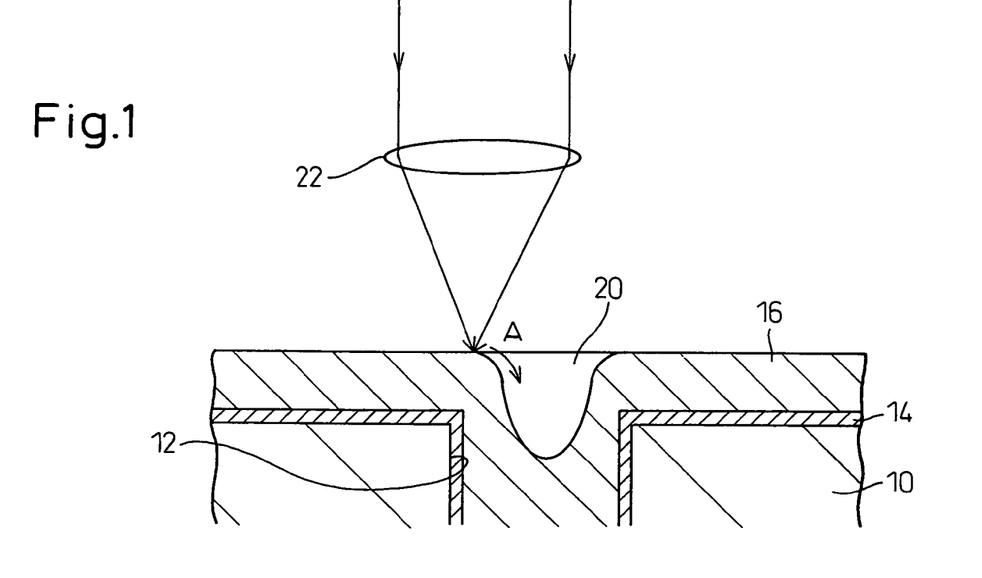
FIG. 1 is a schematic illustration for explaining one embodiment of the inventive method.

As shown in FIG. 1, a through-hole 12 formed in a substrate 10 of insulation material such as resin is filled with metal such as copper by plating. The filling of the metal in the through-hole 12 by plating is carried out in the same manner as shown in FIG. 8.

That is, a seed layer 14 consisting of metal such as copper is formed on the surface of the substrate 10 including the inner wall surface of the through-hole 12 formed in the substrate 10 of insulation material such as resin by electroless plating and, thereafter, a plated metallic layer 16 having a predetermined thickness is formed on the seed layer 14 while filling the through-hole 12, with metal such as copper, by the electrolytic plating wherein the seed layer 14 is used as a power supply layer.

As shown in FIG. 1, there may be a dimple 20 which is a recess of a metal-less portion in the plated metallic layer 16 at a position in correspondence to the opening of the through-hole 12. This dimple 20 is deep and would be left on an end surface of a via even if the plated metallic layer 16 is removed by etching or other methods.

A YAG laser beam focused by a lens 22 is emitted as a "spot" onto the plated metallic layer 16 forming the proximity of the peripheral edge of the dimple 20 to melt part of the plated metallic layer 16. The molten metal flows in the direction indicated by an arrow A to fill the dimple 20.

An amount of molten metal obtained by one "spot-like" emission is small. That is to say, the "spot-like" emission means a laser beam emission to be irradiated on to a very small area. Accordingly, it is necessary to repeat the "spot-like" emission of the YAG laser beam a plurality of times so that the dimple 20 is sufficiently filled with molten metal. At that time, if the "spot-like" emission of the YAG laser beam is repeated at the same point, this point is deeply excavated. To avoid such a trouble, the "spot-like" emission of the YAG laser beam is carried out to a plurality of different points in the vicinity of the peripheral edge of the dimple 20.

Figures 2A, 2B:
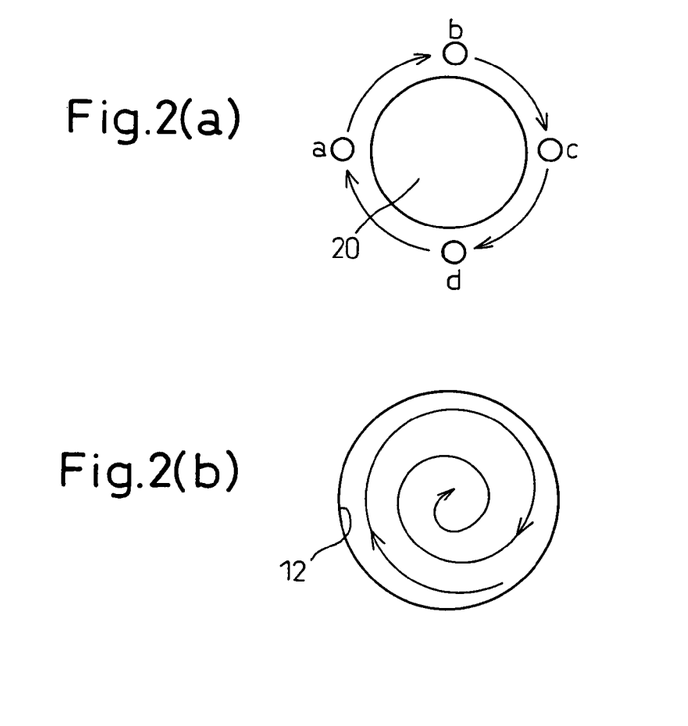
FIGS. 2(a) and 2(b) illustrate the order of the spot-like emission of a laser beam shown in FIG. 1.

When the YAG laser beam is emitted to four points a, b, c and d along the peripheral edge of the dimple 20, for example, as shown in FIG. 2(a), the spot-like emission of the YAG laser beam is preferably carried out in the order of point a to point b, to point c, and to point d.

By repeating the "spot-like" emission of the YAG laser beam a plurality of times in such a manner, the dimple 20 is filled with metal. A degree at which the dimple 20 is filled with metal is such that the dimple 20 is not necessarily completely filled with the metal but disappears after the plated metallic layer 16 has been removed by the etching or others.

Figure 3:
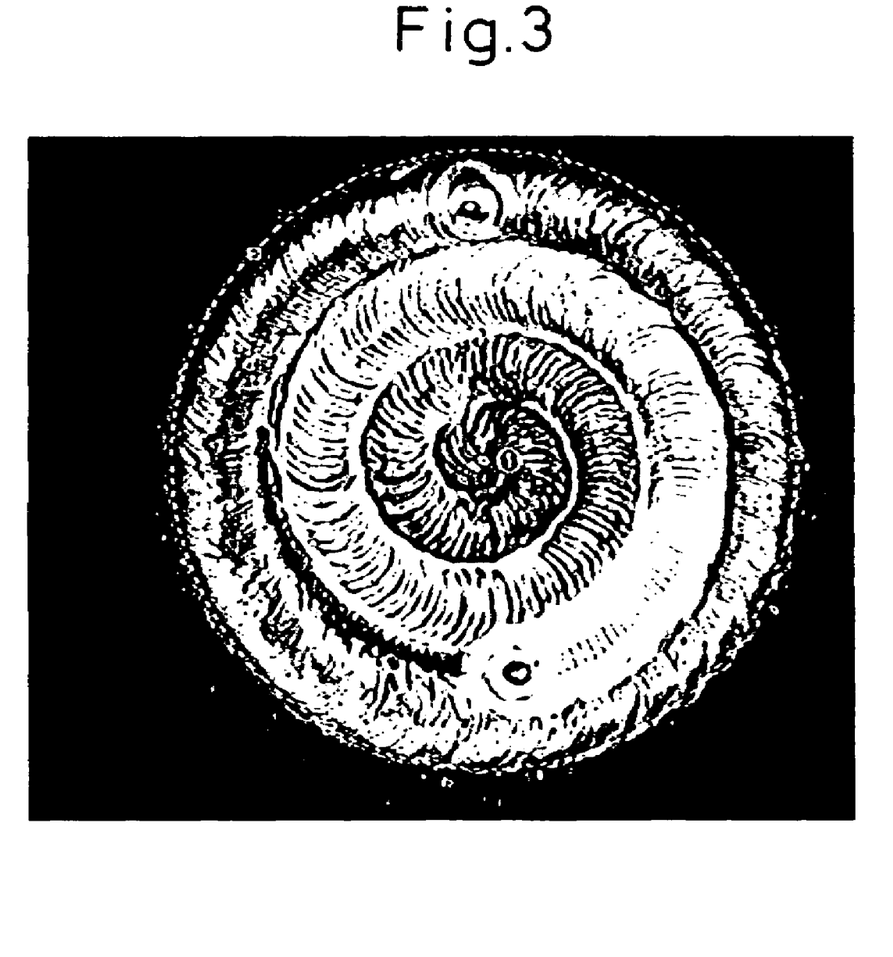
FIG. 3 illustrates a state of an opening after the spot-like emission of the laser beam in the order shown in FIG. 2(b)

Also, the spot-like emission of the YAG laser beam may be sequentially carried out along a spiral path, for example, shown in FIG. 2(b), starting from the proximity of the peripheral edge of the opening of the through-hole 12 and going inward of the opening, whereby a portion of the dimple 20 which has been once filled with the metal is molten again to homogenize the plated metallic layer 16 in correspondence with the opening of the through-hole 12. FIG. 3 illustrates a state of the opening obtained by the spot-like emission of the YAG laser beam along the spiral path starting from the proximity of the peripheral edge of the opening of the through-hole 12 and going inward of the opening. A diameter of the opening of the through-hole 12 is 193 μm and the number of the spot-like emission of the YAG laser beam is 579 times.

As described above, by the spot-like emission of the YAG laser beam sequentially carried out along the spiral path starting from the proximity of the peripheral edge of the opening of the through-hole 12 and going inward of the opening, it is possible, of course, to fill the dimple 20 with metal, as well as to reduce or eliminate the void 208 shown in FIG. 8(d) due to the heating of all the metal filled in the through-hole 12.

After the dimple 20 has been filled with metal by the "spot-like", emission of the YAG laser beam described above, the plated metallic layer 16 is removed by the etching or others to result in the via, penetrating the substrate 10, having flat opposite end surfaces.

It is possible to form a wiring pattern directly on each of the opposite end surfaces of the via, without the necessity for providing a wiring pad having a diameter larger than that of the via. Thereby, the degree of freedom increases in the design of the wiring pattern formed in the substrate 10, and a high-density arrangement of the wiring pattern can be realized.

While part of the plated metallic layer 16 is molten by the repeated spot-like emission of the YAG laser beam to fill the dimple 20 with the molten metal in FIGS. 1 to 3, there is a risk, in this case, that the dimple is not sufficiently filled with the molten metal if the dimple 20 has a large diameter.

Figure 4:
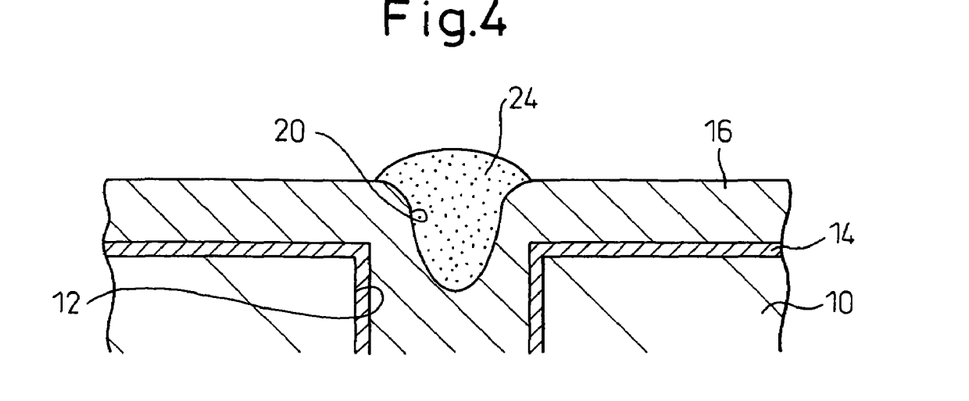
FIG. 4 is a schematic illustration for explaining another embodiment of the inventive method.

To solve such a problem, as shown in FIG. 4, the dimple 20 formed in the plated metallic layer 16 at a position corresponding to the opening of the through-hole 12 is covered with metallic powder 24 of the same kind as that forming the plated metallic layer 16.

Then, the YAG laser beam is spot-likely emitted to a plurality of positions of the metallic powder 24 to melt at least part of the metallic powder 24 and fill the same in the dimple 20.

By melting part of the metallic powder 24 filled in the dimple 20 in advance by the spot-like emission of the YAG laser beam and fill the dimple 20 with the molten metal, it is possible to sufficiently fill the dimple 20 with the metal even if the dimple has a large diameter.

Thereafter, non-molten metallic powder 24 is removed if necessary, and the plated metallic layer 16 is removed by etching or other methods, whereby the via having a flat end surface is obtainable.

Figure 5:
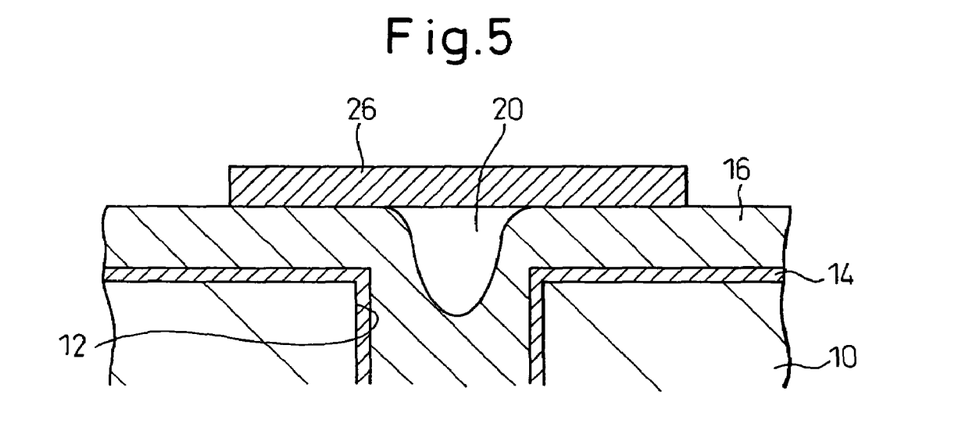
FIG. 5 is a schematic illustration for explaining a further embodiment of the inventive method.

Alternatively, as shown in FIG. 5, after covering the dimple 20 formed in the plated metallic layer 16 at a position corresponding to the opening of the through-hole 12 with metallic foil 26 of the same kind as that forming the plated metallic layer 16, the YAG laser beam is emitted onto a plurality of portions of the metallic foil 26 to melt at least part thereof and fill the dimple 20 with the molten metal.

In this regard, while the YAG laser beam has been used as a laser beam in the description with reference to FIGS. 1 to 5, an excimer laser beam may be used in place of the YAG laser beam, if it would be preferable to use a laser beam having a different wavelength.

Further, while the method for filling the dimple 20 formed in the plated metallic layer 16 at a position corresponding to the opening of the through-hole 12 has been described with reference to FIGS. 1 to 5, this method may be applied to the filling of the seam 212 shown in FIG. 9(b).

In a practical application of this invention, the emission of YAG laser is carried out automatically in accordance with a program regarding the design for the individual wiring board.

It should be understood by those skilled in the art that the foregoing description relates to only a preferred embodiment of the disclosed invention, and that various changes and modifications may be made to the invention without departing the spirit and scope thereof.

The invention claimed is:

1. A process for manufacturing a wiring board comprising a substrate made of an insulation material and having first and second surfaces, first and second conductor patterns formed on the first and second surfaces, respectively, and a via conductor penetrating the substrate to electrically connect the first conductor pattern with the second conductor pattern; the process comprising the following steps of:

forming the substrate with a through-hole penetrating thereto and defining openings at the first and second surfaces, respectively;

plating the substrate with a metal so that a metal layer having a predetermined thickness is formed on the respective first and second surfaces of the substrate and the through-hole is substantially filled with the metal to be the via; and emitting a laser beam, as a plurality of spots, around a metal-less portion of the plated metal, at discontinuous positions corresponding to the openings of the through-hole such that the laser beam is not emitted at a point between successive ones of the discontinuous positions, so that a part of the plated metal melts to fill the metal-less portion with the molten metal.

2. A process as set forth in claim 1, wherein the laser beam is irradiated periodically along a circular peripheral edge of a recess of the metal-less portion.

3. A process as set forth in claim 1, wherein the laser beam is Irradiated periodically along a spiral path inwardly from a peripheral edge of a recess of the metal-less portion.

4. A process as set forth in claim 1, wherein the metal-less portion of the plated metal comprises a dimple, a seam, or a combination thereof.

5. A process for manufacturing a wiring board comprising a substrate made of an insulation material and having first and second surfaces, first and second conductor patterns formed an the first and second surfaces, respectively, and a via conductor penetrating the substrate to electrically connect the first conductor pattern with the second conductor pattern; the process comprising the following steps of:

forming the substrate with a through-hole to penetrate the substrate from the first surface to the second surface;

plating the substrate with a metal so that a metal layer having a predetermined thickness is formed on the respective first and second surfaces of the substrate and the through-hole is substantially filled with the metal to be the via;

covering, with a metal foil or metal powder, a metal-less portion of the plated metal, at positions corresponding to the openings of the through-hole; and irradiating a laser beam, as a plurality of spats, onto the metal foil or metal powder, at discontinuous positions such that the laser beam is not irradiated onto a point between successive ones of the discontinuous positions so that at least a part of the metal foil or powder melts to fill the metal-less portion with molten metal.

6. A process as set forth in claim 5, wherein the laser beam is irradiated periodically along a circular peripheral edge of the metal-less portion.

7. A process as set forth in claim 5, wherein the laser beam is irradiated periodically along a spiral path inwardly from a peripheral edge of the metal-less portion.

8. A process as set forth in claim 5, wherein the metal-less portion of the plated metal comprises a dimple, a seam, or a combination thereof.

* * * * *

UNITED STATES PATENT AND TRADEMARK OFFICE
CERTIFICATE OF CORRECTION

PATENT NO. : 7,205,230 B2
APPLICATION NO. : 10/914227
DATED : April 17, 2007
INVENTOR(S) : Naohiro Mashino It is certified that error appears in the above-identified patent and that said Letters Patent is hereby corrected as shown below:

Column 5, Line 56, change ""spot-like","" to --"spot-like"--.

Column 7, Line 10, change "Irradiated" to --irradiated--.

Column 7, Line 18, change "an" to --on--.

Column 8, Line 7, change "spats," to --spots,--.

Column 8, Line 10, after "positions" insert --,--.

Signed and Sealed this

Seventh Day of August, 2007

JON W. DUDAS
*Director of the United States Patent and Trademark Office*